US006548943B2

United States Patent

Kaitila et al.

(10) Patent No.: US 6,548,943 B2
(45) Date of Patent: Apr. 15, 2003

(54) METHOD OF PRODUCING THIN-FILM BULK ACOUSTIC WAVE DEVICES

(75) Inventors: Jyrki Kaitila, Helsinki (FI); Juha Ellä, Halikko (FI)

(73) Assignee: Nokia Mobile Phones Ltd., Espoo (FI)

( * ) Notice: Subject to any disclaimer, the term of this patent is extended or adjusted under 35 U.S.C. 154(b) by 92 days.

(21) Appl. No.: 09/833,804

(22) Filed: Apr. 12, 2001

(65) Prior Publication Data

US 2002/0149300 A1 Oct. 17, 2002

(51) Int. Cl.[7] .......................... H01L 41/04; H01L 41/08; H02N 2/00
(52) U.S. Cl. ........................................ 310/364; 310/365
(58) Field of Search ................................. 310/364, 330

(56) References Cited

U.S. PATENT DOCUMENTS

| | | | | | |
|---|---|---|---|---|---|
| 3,634,749 A | * | 1/1972 | Montgomery | ................ | 708/816 |
| 3,641,355 A | * | 2/1972 | Preston, Jr. | .................. | 250/229 |
| 3,676,590 A | * | 7/1972 | Weimer | ....................... | 348/310 |
| 3,745,353 A | * | 7/1973 | Jernigan et al. | ............. | 250/216 |
| 3,769,615 A | * | 10/1973 | de Klerk | ..................... | 333/149 |
| 3,970,778 A | * | 7/1976 | Adkins | ........................ | 348/198 |
| 4,017,751 A | * | 4/1977 | Desormiere et al. | ........ | 310/334 |
| 4,041,536 A | * | 8/1977 | Melcher et al. | ............. | 348/198 |
| 4,225,887 A | * | 9/1980 | Gautier | ........................ | 348/198 |
| 4,225,938 A | * | 9/1980 | Turpin | ........................ | 708/816 |
| 4,686,111 A | * | 8/1987 | Cho et al. | .................... | 427/534 |
| 5,789,845 A | * | 8/1998 | Wadaka et al. | ............. | 310/334 |
| 6,081,171 A | | 6/2000 | Ella | ............................ | 333/189 |
| 6,278,342 B1 | * | 8/2001 | Ella | ............................ | 333/189 |
| 6,476,536 B1 | * | 11/2002 | Pensala | ....................... | 310/312 |

FOREIGN PATENT DOCUMENTS

WO  0106647  1/2001  ............ H03H/9/17

* cited by examiner

*Primary Examiner*—Thomas M. Dougherty
*Assistant Examiner*—J. Aguirrechea
(74) *Attorney, Agent, or Firm*—Ware, Fressola, Van der Sluys & Adolphson LLP

(57) ABSTRACT

A method of producing a BAW device with reduced spurious resonance, wherein the device comprises a top electrode, a bottom electrode and a piezoelectric layer therebetween. A frame-like structure is formed on top of the top electrode for suppressing the spurious resonances. The frame-like structure is produced in a self-aligning fashion in that the frame-like structure is used to define the top electrode area. Furthermore, it is preferred that the frame-like structure is made of a different material from the top electrode. The frame-like structure is caused to fuse with the contacting part of the top electrode to form an alloy. An etching mask is then used to cover at least part of the frame-like structure and the entire top electrode surrounded by the frame-like structure for etching. An etching medium is used to remove the unreacted portion of the top electrode outside the frame-like structure.

8 Claims, 16 Drawing Sheets

METHOD OF PRODUCING THIN-FILM BULK ACOUSTIC WAVE DEVICES

FIELD OF THE INVENTION

The present invention relates generally to bulk acoustic wave resonators and filters and, more particularly, to the fabrication of resonators operated in the piston mode.

BACKGROUND OF THE INVENTION

It is known that a bulk acoustic-wave (BAW) device is, in general, comprised of a piezoelectric layer sandwiched between two electronically conductive layers that serve as electrodes. When a radio frequency (RF) signal is applied across the device, it produces a mechanical wave in the piezoelectric layer. The fundamental resonance occurs when the wavelength of the mechanical/acoustic wave (produced by the RF signal) is about twice the thickness of the piezoelectric layer. Although the resonant frequency of a BAW device also depends on other factors, the thickness of the piezoelectric layer is the predominant factor in determining the resonant frequency. As the thickness of the piezoelectric layer is reduced, the resonance frequency is increased. BAW devices have traditionally been fabricated on sheets of quartz crystals. In general, it is difficult to achieve a device of high resonance frequency using this fabrication method. When fabricating BAW devices by depositing thin-film layers on passive substrate materials, one can extend the resonance frequency to the 0.5–10 GHz range. These types of BAW devices are commonly referred to as thin-film bulk acoustic resonators or FBARs. There are primarily two types of FBARs, namely, BAW resonators and stacked crystal filters (SCFs). An SCF usually has two or more piezoelectric layers and three or more electrodes, with some electrodes being grounded. The difference between these two types of devices lies mainly in their structures. FBARs are usually used in combination to produce passband or stopband filters. The combination of one series FBAR and one parallel FBAR makes up one section of the so-called ladder filter. The description of ladder filters can be found, for example, in Ella (U.S. Pat. No. 6,081,171). As disclosed in Ella, an FBAR-based device may have one or more protective layers commonly referred to as the passivation layers. A typical FBAR-based device is shown in FIGS. 1a and 1b. As shown in FIGS. 1a and 1b, the FBAR device comprises a substrate 110, a bottom electrode 120, a piezoelectric layer 130, and a top electrode 140. The FBAR device may additionally include a membrane layer 112 and a sacrificial layer 114, among others. The substrate can be made from silicon (Si), silicon dioxide (SiO2), Galium Arsenide (GaAs), glass or ceramic materials. The bottom electrode and top electrode can be made from gold (Au), molybdenum (Mo), tungsten (W), copper (Cu), nickel (Ni), titanium (Ti), Niobium (Nb), silver (Ag), tantalum (Ta), cobalt (Co), or aluminum (Al). The piezoelectric layer 130 can be made from zinc oxide (ZnO), zinc sulfide (ZnS), aluminum nitride (AlN), lithium tantalate (LiTaO$_3$) or other members of the so-called lead lanthanum zirconate titanate family. The passivation layer is typically made from a dielectric material, such as SiO2, Si3N4, or polyimide, to serve as an electrical insulator and to protect the piezoelectric layer. It should be noted that the sacrificial layer 114 in a bridge-type BAW device is, in general, etched away in the final fabrication stages to create an air interface beneath the device. In a mirror-type BAW device, there is an acoustic mirror structure beneath the bottom electrode 120. The mirror structure consists of several layer pairs of high and low acoustic impedance materials, usually quarter-wave thick. The bridge-type and the mirror-type BAW devices are known in the art.

The desired electrical response in an FBAR-based device is achieved by a shear or longitudinal acoustic wave propagating in the vertical thickness through the device. Besides these wave modes, there exist other modes, known as the Lamb waves, that may deteriorate the electrical response. In quartz crystals, the strength of these spurious modes is controlled by adjusting the thickness and the width of the top electrode. In an FBAR-based device, the dimension in thickness direction is so small that it renders thickness adjustment difficult and impractical. A possible solution to the problems associated with the spurious modes is to thicken the edge of the top electrode. As disclosed in Kaitila et al. (WO 01/06647 A1, hereafter referred to as Kaitila), a frame-like structure 150 is formed on top of the top electrode 140 to thicken the edge thereof. As shown in FIGS. 1a and 1b, the frame-like structure 150 is a rectangular frame for defining a first zone and a second zone for acoustic wave excitation. The first zone is the area under the rectangular frame 150, and the second zone 148 is the area surrounded by the rectangular frame 150. With such a structure, the cut-off frequency of the piezoelectrically excited wave modes in the first zone and that of the second zone are different. When the width of the frame-like structure and the acoustic properties of the layer structure are properly arranged, the displacement relating to the strongest of the piezoelectrically excited resonance modes is substantially uniform in the second zone. Thus, the spurious resonances in the electric response of the bulk acoustic wave device are suppressed, and the FBAR is said to operate in a piston mode.

It should be noted that, as disclosed in Kaitila, the frame-like structure may be circular, square, polygonal, regular or irregular. Also, the frame-like structure can have different configurations, as shown in FIGS. 2 and 3, to achieve the piston mode. As shown in FIGS. 2 and 3, part of the piezoelectric layer 130 is covered by a passivation layer 160, and part of the passivation layer is sandwiched between the piezoelectric layer 130 and the frame-like structure 150 extended upward from the edge of the top electrode 140. In FIGS. 2 and 3, the frame-like structure 150 is basically where the top electrode 140 overlaps with the passivation layer 130. It should be noted that, FIG. 1a is a cross section view of a BAW device, as viewed in the lateral direction and the top, while FIG. 2 and FIG. 3 are cross section views of a BAW device, as viewed in the horizontal direction.

Traditionally, the frame-like structure is fabricated by forming an electrically conducting layer on top of the passivation layer and an exposed part of the piezoelectric layer, and removing part of the electrically conducting layer, as shown in FIGS. 4a–4e. In FIGS. 4a–4e, only the top few layers are shown. As shown, the device has a patterned passivation layer 160, which covers most of the piezoelectric layer 130 but leaves a section 132 of the top surface exposed. A top metal layer 128 is formed on top of the passivation layer 160 and the exposed portion 132 of the piezoelectric layer 130. The portion of the top metal layer 128 that is in direct contact to the piezoelectric layer 130 is denoted by reference numeral 148, as shown in FIG. 4b. As shown in FIG. 4c, an etching mask 200, such as a photoresist mask, is provided on top of the device. As shown in FIG. 4c, the mask 200 is skewed to the left in reference to the center portion 148. The exposed parts of the top metal layer 128 can be removed with an etching process to form an upper electrode 140, as shown in FIG. 4c. FIG. 4d shows the device after the etching mask 200 has been stripped. As shown, the upper electrode 140 has a frame-like structure similar to the structure 150 as shown in FIG. 3. However, the left section 150' of the top electrode 140 is much broader than the right section 150", and this is not the intended result. For example, the intended result is that the left section 150' and the right section 150" are substantially the same. As such, the operation of the device in piston mode may be compromised. The unintended result is due to the misalignment of the mask 200. FIG. 4c is used to illustrate the disadvantage of the traditional fabrication method, where the mask 200 is not positioned as intended. The mask 200 is intended to be symmetrically positioned with regard to the center portion 148, for example.

Even in the case when the mask 200 is correctly positioned there is a possibility that unintended results arise because of limitations in the manufacturing process. For example, the top metal 128 can be over-etched, as shown in FIG. 4f, causing a section 152' to be etched away from the left section 150' and a section 152" to be etched away from the right section 150". In this case the suppression of spurious resonances may become less effective, because the width of the frame like structure is different than planned.

Thus, it is advantageous and desirable to provide a method of producing bulk acoustic wave devices, wherein the frame-like structure on top of the top electrode for suppressing spurious resonance can be fabricated more consistently and precisely.

SUMMARY OF THE INVENTION

It is a primary object of the present invention to achieve a bulk acoustic wave device operating substantially in a piston mode, wherein a frame-like structure on the top electrode of the bulk acoustic wave device is used to reduce the spurious resonance, and wherein the width of the frame-like zone around the frame-like structure is consistent with the requirement of the piston mode. The object can be achieved by using a self-aligning fabrication process, wherein the width of the frame-like structure is substantially determined by the step of forming the frame-like structure, and not determined by an etching step thereafter. It should be noted that the frame-like zone around the frame-like structure is, in general, symmetrical, but the width of the zone may not be uniform in all cases. In some cases, the frame-like structure needs to be designed with varying width at different points of the periphery. For example, in the corner areas of a rectangular frame-like structure, it is necessary to have minor variations in the width to achieve a good piston mode. The object of the present invention is to achieve a frame-like structure substantially as designed.

Thus, according to the first aspect of the present invention, a method of producing a bulk acoustic wave device with reduced spurious resonance, wherein the device has a piezoelectric layer having a first side and an opposing second side, a first electrode layer provided on the first side of the piezoelectric layer and a second electrode layer provided on the second side of the piezoelectric layer. The method comprises the steps of:

(a) providing a frame-like structure in contact with the first electrode layer, wherein the frame-like structure has an outer boundary enclosing a first area and an inner boundary enclosing a second area;

(b) causing the frame-like structure to fuse with the contacting portion of the first electrode layer to form a fused portion, wherein the fused portion surrounds a section of the first electrode layer;

(c) providing a mask on top of the first electrode layer including the fused portion, wherein the mask has a perimeter defining a masking area larger than the second area but smaller than or equal to the first area of the frame-like structure, and the mask is positioned to cover entirely the surrounded section of the first electrode layer and at least part of the fused portion, thereby exposing remaining portion of the electrode layer outside the fused portion; and (d) removing the remaining portion of the first electrode layer for forming a modified electrode layer.

Optionally, when the second electrode layer is the bottom electrode of the device, it is preferable to have the following steps carried out prior to providing the first electrode layer on the piezoelectric layer:

(e) providing a dielectric layer on the first side of the piezoelectric layer, wherein the frame-like structure is provided on top of the dielectric layer;

(f) providing a further mask over the frame-like structure and the dielectric layer, wherein the further mask has an inner boundary defining a clear area, which is larger than the second area but smaller than the first area of the frame-like structure, and wherein the further mask is so positioned that the inner boundary of the further mask is located between the outer boundary and the inner boundary of the frame-like structure, thereby exposing through the clear area a portion of the dielectric layer and shielding a remaining portion of the dielectric layer underlying the first mask;

(g) removing the exposed portion of the dielectric layer for exposing a portion of the piezoelectric layer defined by the inner boundary of the frame-like structure; and (h) removing the further mask so as to allow the first electrode layer to be provided on top of the exposed portion of the piezoelectric layer and at least a portion of the dielectric layer.

Preferably, the removing of the exposed portion of the dielectric layer in step (g) is carried out by a dry etching process.

Preferably, the frame-like structure is made of nickel and the electrically conducting layer is made of aluminum to form an alloy of nickel and aluminum.

It is possible that the frame-like structure is made of silicon and the electrically conducting layer is made of titanium to form an alloy of titanium silicide.

Optionally, a hard mask is provided on the frame-like structure prior to step (f).

Preferably, the hard mask is made of aluminum nitride, and the removing of the exposed portion of the dielectric layer in step (g) is carried out by a fluorine plasma etching process.

Preferably, the dielectric layer is made of silicon dioxide ($SiO_2$) or silicon nitride ($Si_3N_4$).

The bulk acoustic wave device can be a bulk acoustic wave resonator, a stacked crystal filter, a low frequency device, such as a single crystal resonator, or a combination thereof.

According to the second aspect of the present invention, a bulk acoustic wave device with reduced spurious resonance, wherein the device has a piezoelectric layer having a first side and an opposing second side, a first electrode layer provided on the first side and a second electrode layer provided on the second side of the piezoelectric layer. The device comprises:

a frame-like structure in contact with the first electrode layer, wherein the frame-like structure has an outer border and an inner border, and the frame-like structure is caused to fuse with the contacting portion of the first electrode layer to form a fused portion, and wherein the fused portion defines a first section of the first electrode layer within the fused portion and a second section of the first electrode layer outside the fused portion, which is removed from the piezoelectric layer.

Alternatively, the device comprises a dielectric layer provided on the piezoelectric layer and the frame-like structure provided on the dielectric layer prior to providing the first electrode layer, wherein the dielectric layer inside the inner border of the frame-like structure is removed to expose a section of the first side of the piezoelectric layer so as to allow the first electrode layer to be provided on the device in contact with the exposed section of the piezoelectric layer, the frame-like structure.

The present invention will become apparent upon reading the description taken in conjunction with FIGS. 5a–7f.

BRIEF DESCRIPTION OF THE DRAWINGS

FIG. 1b is a top view of the bulk acoustic wave device, as shown in FIG. 1a.

DETAILED DESCRIPTION

The present invention is primarily concerned with the fabrication of the frame-like structure on top of the top electrode of a bulk acoustic wave device to achieve a piston mode operation. It is understood that the top electrode and the bottom electrode are formed on opposite sides of a piezoelectric layer in the bulk acoustic wave device to generate piezoelectrically excited acoustic signals, and the frame-like structure is used to reduce spurious resonance in the piezoelectrically excited acoustic signals. The bulk acoustic wave device can be a resonator, a filter, a stacked crystal filter, and any combination thereof. The bulk acoustic wave device can have one, two or more piezoelectric layers, one or more mirrors, membranes, sacrificial bridge structures and other related structures. The bottom electrode is usually formed on a sacrificial bridge structure in a bridge-type BAW device, or on top of the mirror structure of a mirror-type BAW device. The bridge-type BAW device and the mirror-type BAW device are known in the art. Thus, for clarity, only a few layers of a BAW are used to illustrate the present invention.

Figure 4A:
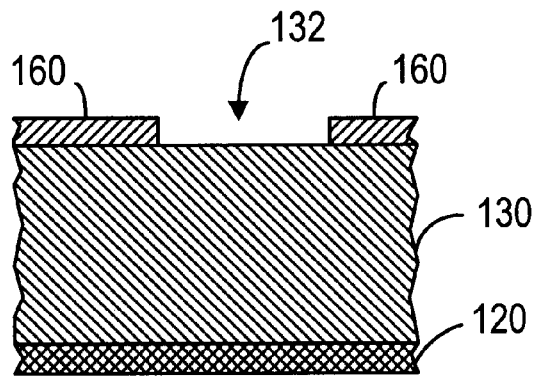
FIG. 4a is a cross sectional view illustrating a process step in a traditional fabricating method, wherein a patterned passivation layer is formed on top of a piezoelectric layer.
Figure 5A:
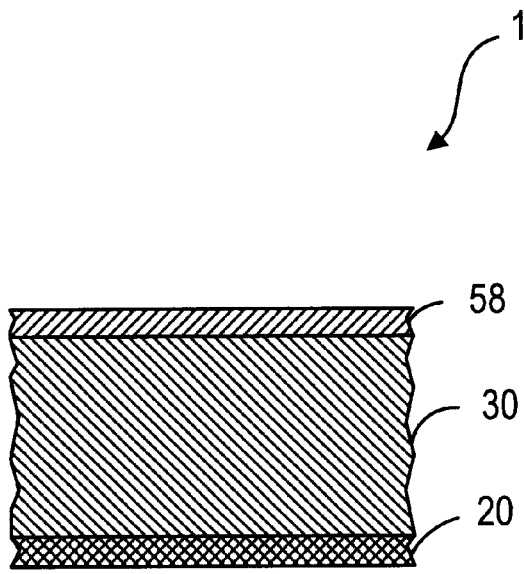
FIG. 5a is a cross sectional view illustrating a non-patterned dielectric layer provided on top of the piezoelectric layer, according to the present invention.

FIGS. 5a–5j illustrate the self-alignment method of the present invention, regarding the frame-like structure. In order to compare the present invention with the traditional method, the starting component 1, as shown in FIG. 5a, is chosen to have a shape or structure similar to the starting component as shown in FIG. 4a. In FIG. 4a, the starting component has a passivation layer 160, which is patterned to expose a portion of the piezoelectric layer 130. In FIG. 5a, the starting component 1 has a non-patterned dielectric layer 58 shielding the entire upper surface of the piezoelectric layer 30. The forming of the bottom electrode 20 and the piezoelectric layer 30 on a substrate 10 is known in the art.

Figure 1A:
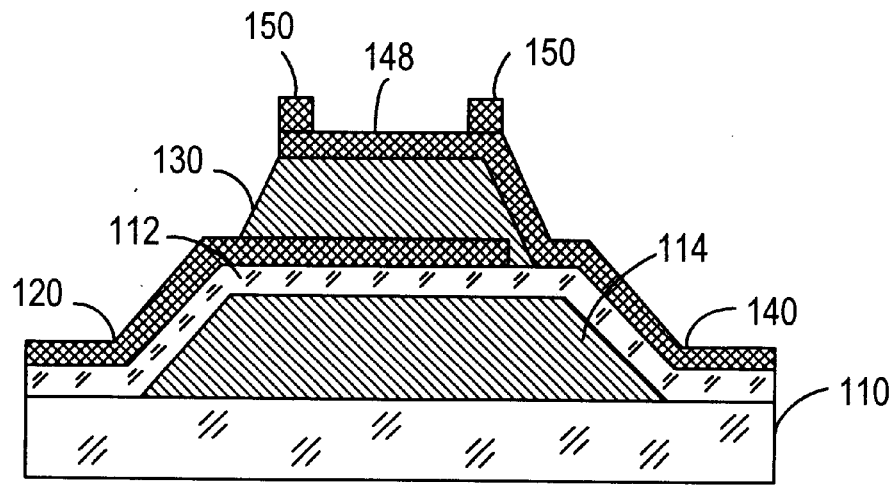
FIG. 1a is a cross sectional view illustrating a bulk acoustic wave device having a top electrode with a thickened edge or frame-like structure provided thereon for reducing spurious resonance.
Figure 1B:
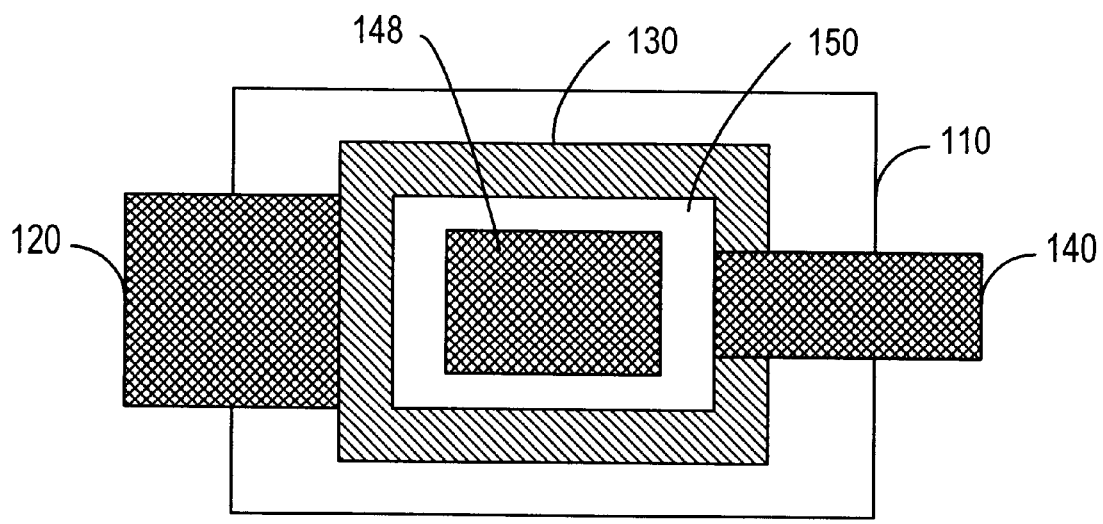
Figure 2:
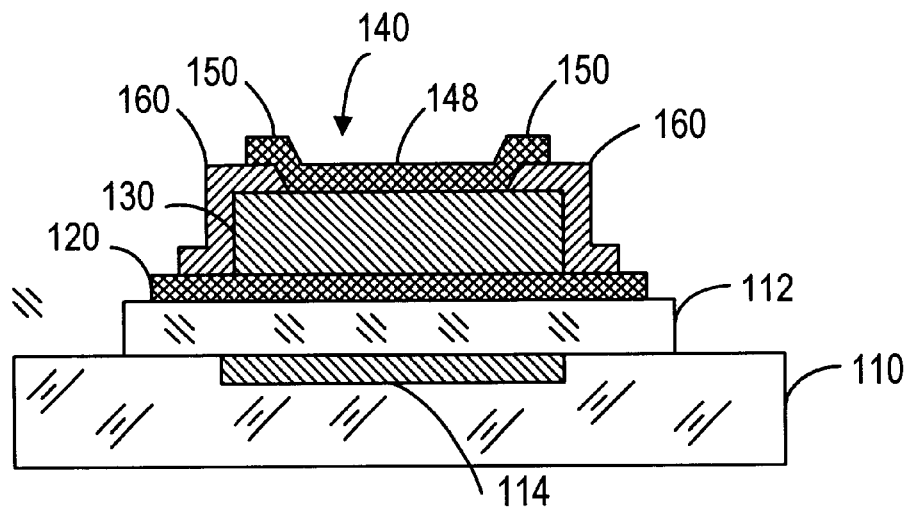
FIG. 2 is a cross sectional view illustrating another bulk acoustic wave device having a frame-like structure on top of the top electrode.
Figure 3:
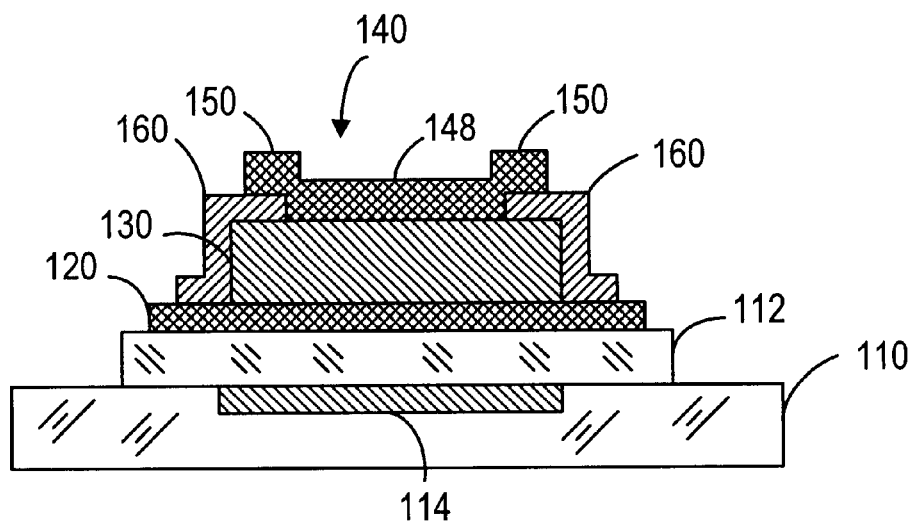
FIG. 3 is a cross sectional view illustrating yet another bulk acoustic wave device having a frame-like structure on top of the top electrode.
Figure 4B:
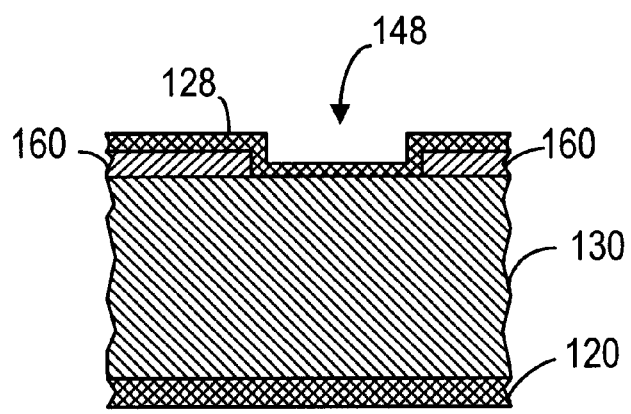
FIG. 4b is a cross sectional view illustrating the step of forming an electrically conducting layer.
Figure 4C:
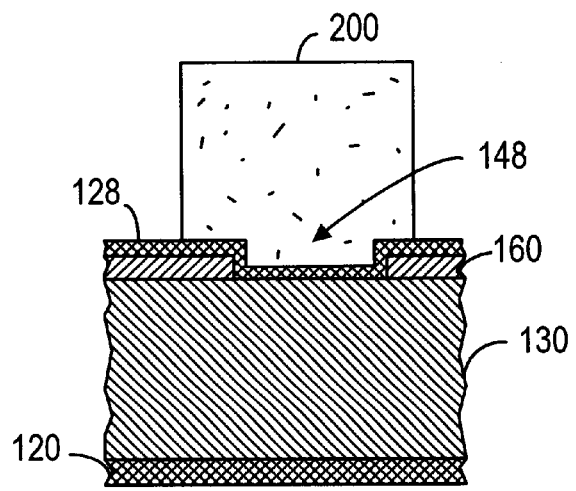
FIG. 4c is a cross sectional view illustrating the step of forming a mask on part of the electrically conducting layer.
Figure 4D:
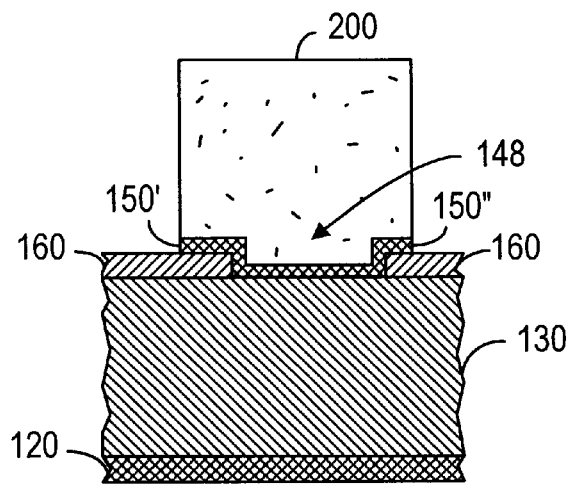
FIG. 4d is a cross sectional view illustrating the removal of the unshielded portion of the electrically conducting layer to form the top electrode.
Figure 4E:
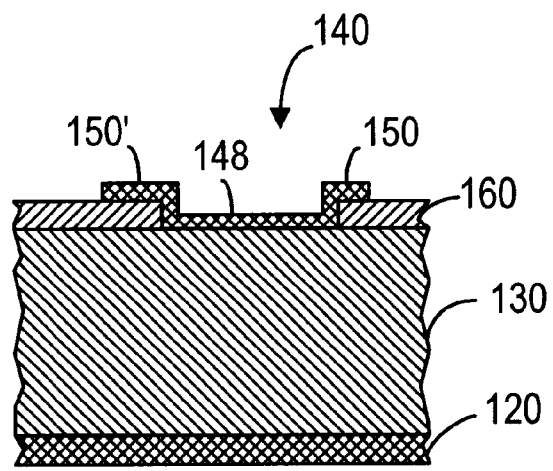
FIG. 4e is a cross sectional view illustrating the top electrode after the mask is stripped.
Figure 4F:
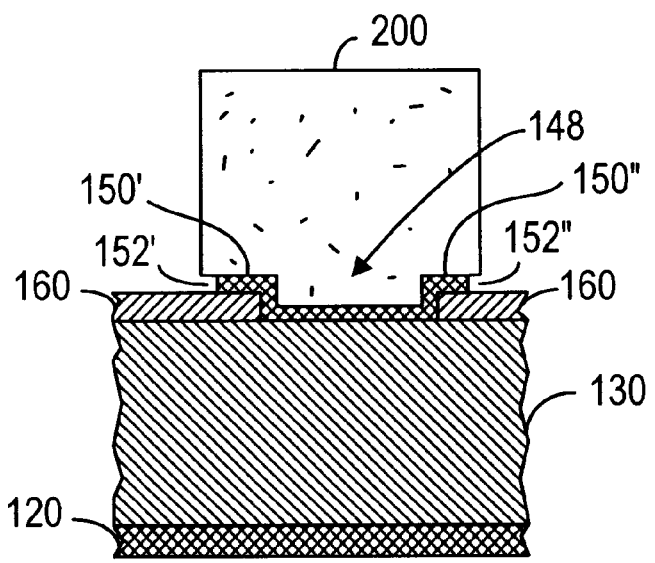
FIG. 4f is a cross sectional view illustrating the lateral etching of the electrically conducting layer underneath the mask.
Figure 5B:
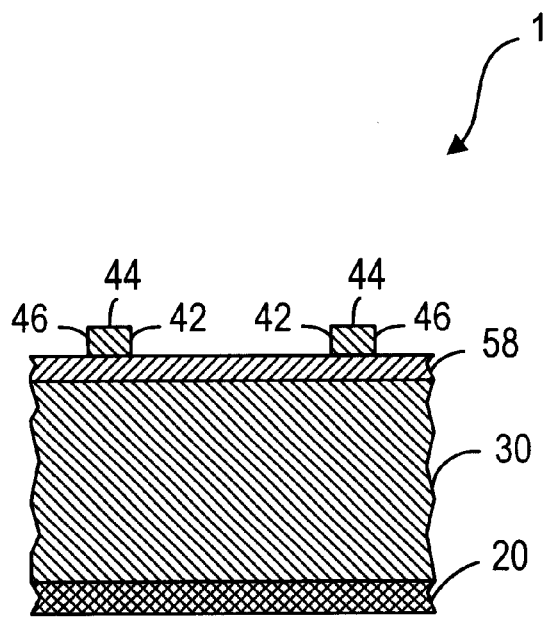
FIG. 5b is a cross sectional view illustrating how a frame-like structure is formed on top of the dielectric layer, according to the present invention.
Figure 5C:
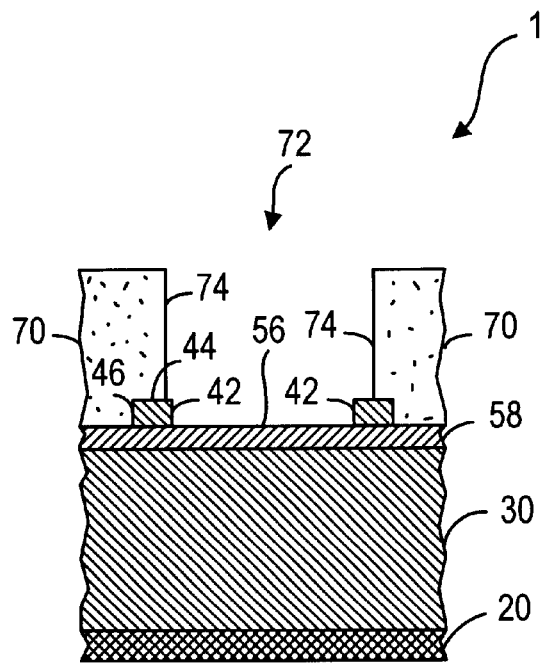
FIG. 5c is a cross sectional view illustrating how a first etching mask is formed, according to the present invention.
Figure 5D:
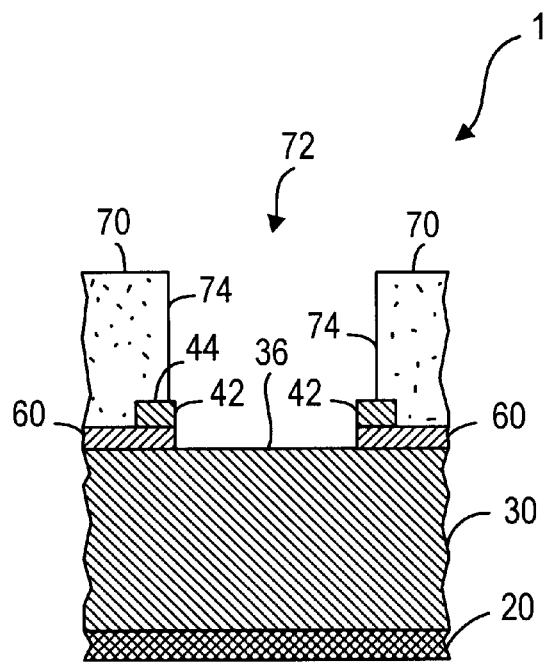
FIG. 5d is a cross sectional view illustrating how a section of the dielectric layer is removed, according to the present invention.
Figure 5E:
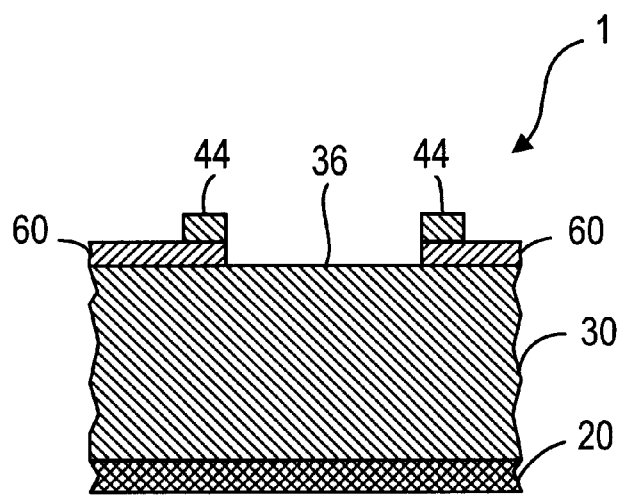
FIG. 5e is a cross sectional view illustrating how the first etching mask is removed, according to the present invention.
Figure 5F:
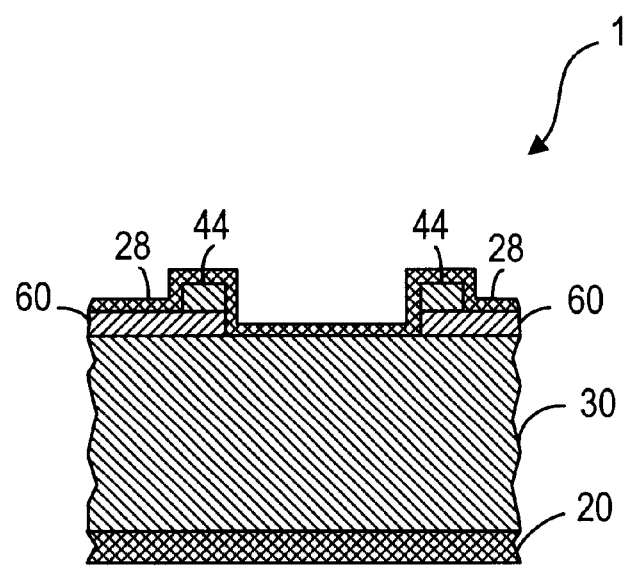
FIG. 5f is a cross sectional view illustrating how a non-patterned electrically conducting layer is formed, according to the present invention.
Figure 5G:
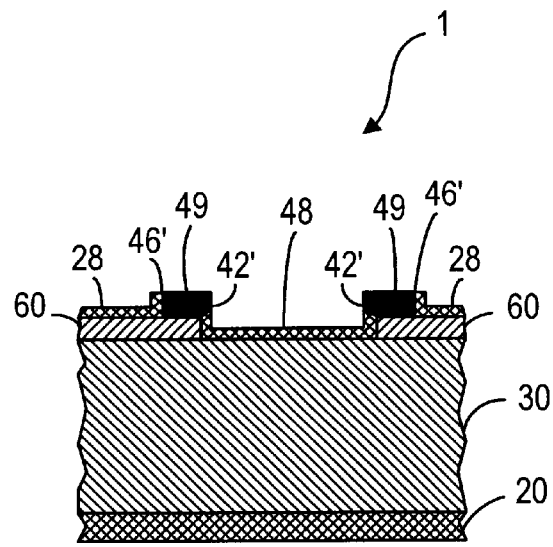
FIG. 5g is a cross sectional view illustrating how the frame-like frame and part of the electrically conducting layer are fused to form an alloy, according to the present invention.
Figure 5H:
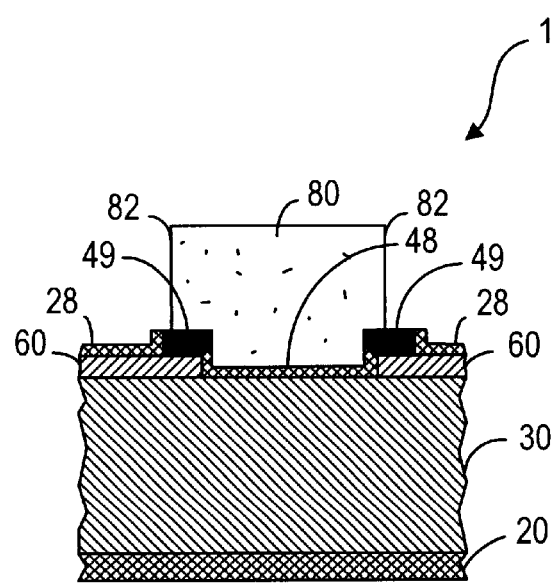
FIG. 5h is a cross sectional view illustrating how a second etching mask is formed, according to the present invention.
Figure 5I:
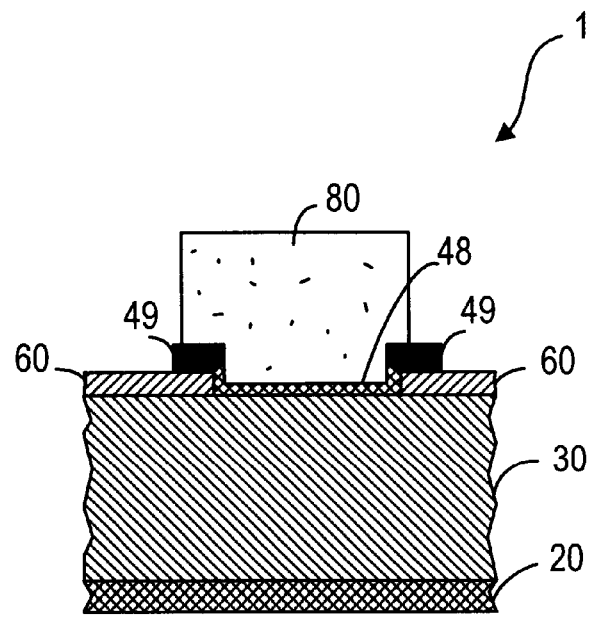
FIG. 5i is a cross sectional view illustrating how the exposed portion of the electrically conducting layer is removed, according to the present invention.

Referring to FIG. 5b, a frame-like structure 44 is provided on the dielectric layer 58 at an appropriate location for the placement of the top electrode in later steps. However, the alignment of the frame-like structure 44, in reference to the dielectric layer 58 and the piezoelectric layer therebelow, is not critical with regard to the bottom electrode 20 if the bottom electrode 20 is sufficiently larger than the frame-like structure 44. It should be noted that when the bottom electrode 20 is not sufficiently larger than the outer boundary 46 of the frame-like structure 44, the alignment of the frame-like structure with regard to the bottom electrode 20 becomes more critical. The shape of the frame-like structure 44 can be rectangular, similar to the frame-like structure 150, as shown in FIG. 1b, but it can also be circular, elliptical, polygonal and the like. The frame-like structure 44 can also be irregular or of any shape. The frame-like structure 44 has an outer boundary 46 and an inner boundary 42. These boundaries define the width of the frame-like structure 44. As shown, the width of the frame-like structure 44 on opposite sides is designed to be substantially identical. However, the width of the frame-like structure 44 can vary from one location to another. The frame-like structure 44 can be formed by any known deposition process, such as sputtering, vacuum evaporation or chemical vapor deposition. It is preferable that the frame-like structure 44 is made of a material that has high etching selectively with regard to the dielectric layer 58. The material for the frame-like structure and the etching selectivity will be discussed later. As shown in FIG. 5c, an etching mask 70 having a clear area 72 is formed on top of the frame-like structure 44 and the dielectric layer 58. It is preferred that the clear area 72, which is defined by a boundary 74, is smaller than the area bounded by the outer boundary 46 of the frame-like structure 44, but larger than the area bounded by the inner boundary 42. The etching mask 70 can be made of a photoresist material, as shown in FIG. 4c. However, the alignment of the etching mask 70 is not critical. The boundary 74 of the clear area 72 can be anywhere between the inner boundary 42 and the outer boundary 46 of the frame-like structure 44, so long as the clear area 72 properly exposes the area 56 of the dielectric layer 58 for etching. When the etching mask 70 is so positioned, the remaining part of the dielectric layer 58 is protected from etching as it underlies the etching mask 70 and the frame-like structure 44. After the exposed area 56 of the dielectric layer 58 is removed by an etching process, as shown in FIG. 5d, a portion 36 of the piezoelectric layer 30 is exposed. The exposed area 56 of the dielectric layer 58 can be removed by a dry etching process, for example. However, the frame-like structure 44 must be made out of a material which is resistive to the etching process. As shown, the exposed portion 36 of the piezoelectric layer 30 is substantially defined by the inner boundary 42 of the frame-like structure 44. The remaining part of the dielectric layer 58 becomes a passivation layer 60 of the device 1, similar to the passivation layer 160 as shown in FIGS. 4a–4c. As shown in FIG. 5e, the etching mask 70 is stripped, exposing the frame-like structure 44, the passivation layer 60 and exposed portion 36 of the piezoelectric layer 30. As shown in FIG. 5f, an electrically conductive layer 28 is formed on top of the device to cover the frame-like structure 44, the exposed portion 36 of the piezoelectric layer 30, and at least part of the passivation layer 60. The frame-like structure 44 can be made of silicon (Si), titanium (Ti), cobalt (Co), nickel (Ni) or other metal, and the electrically conductive layer 28 can be made of a metal which is different from the material for the frame-like structure 44. For example, it is possible to make the frame-like structure 44 out of nickel and the electrically conductive layer 36 out of aluminum. The nickel in the frame-like structure 44 and the aluminum in the electrically conductive layer 36 are caused to fuse to become an alloy by a heating process, for example. The fused portion of the electrically conductive layer 36 and the frame-like structure 44 is denoted by reference numeral 49, as shown in FIG. 5g. As shown in FIG. 5g, the unreacted or unfused portion of the electrically conductive layer 28 includes a center section 48, which is surrounded by the fused, frame-like structure 49. It should be noted that the outer boundary 46' and the inner boundary 42' of the fused, frame-like structure 49, are substantially equal to or slightly different from the outer boundary 46 and the inner boundary 42 of the frame-like structure 44. The width of the fused frame-like structure 49, in general, is greater than the width of the frame-like structure 44, as shown in FIG. 5e. As shown in FIG. 5h, a second etching mask 80 is provided on top of the fused, frame-like structure 49 for removing the unreacted portion of the electrically conductive layer 28 outside the outer boundary 46' of the fused, frame-like structure 49. It is preferred that the etching mask 80 has a perimeter 82 to define a the masking area, wherein the masking area is larger than the center section 48 of the electrically conductive layer 28. Thus, the perimeter 82 is slightly smaller than the outer boundary of the fused, frame-like structure 46' but larger than the inner boundary 42'. When the etching mask 80 is positioned such that the perimeter 82 is located between the outer boundary 46' and the inner boundary 42', the etching mask 80 provides a shield for part of the fused, frame-like structure 49 and the entire center section 48 of the electrically conducting layer 28. Again, the position of the etching mask 80 is not critical. When the frame-like structure 44 is made of nickel and the electrically conductive layer 36 is made of aluminum, it is possible to use an etching medium, such as the standard aluminum etching solution PS 70-10 (consisting mainly of phosphorous acid H3PO4 and nitric acid HNO3), to selectively remove the exposed portion of the unreacted, electrically conducting layer 28, as shown in FIG. 5i. The etching medium, which is not shown, does not substantially remove the exposed portion of the fused, frame-like structure 49 because nickel and the alloy of nickel and aluminum are resistant to PS70-10.

It is also possible to use silicon (Si) to make the frame-like structure 44 and titanium (Ti) for the electrically conducting layer 28. In that case, the etching medium can be a mixture of hydrochloric acid (HCl) and sulfuric acid (H2SO4).

Figure 5J:
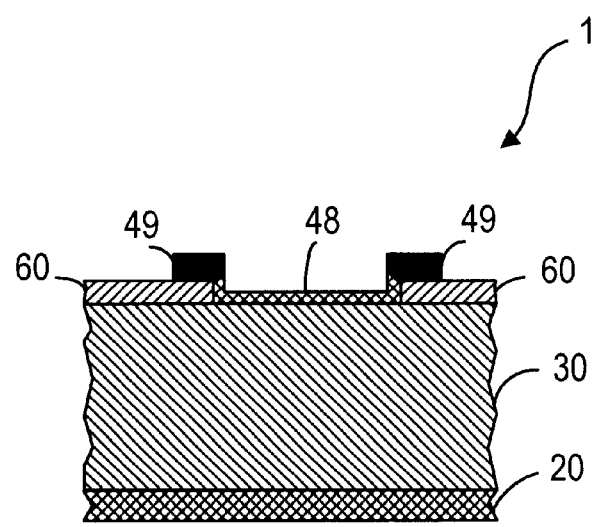
FIG. 5j is a cross sectional view illustrating how the second etching mask is removed, according to the present invention.

The alignment of the etching mask 80, in reference to the fused, frame-like structure 49, is not critical. For example, as shown in FIGS. 5h and 5i, the etching mask 80 is slightly skewed to the left, in reference to the fused, frame-like structure 49 and the center section 48. After the etching mask 80 is stripped, a BAW device 1 having a top electrode 48 surrounded by a thickened edge or frame-like structure 49 is thus achieved, as shown in FIG. 5j. The width of thickened edge or frame-like structure 49 on both sides thereof can be produced substantially as intended. Thus, the FBAR structure achieved by the fabrication process, as described in conjunction with FIGS. 5a–5g, can be referred to as a self-aligning structure.

It should be noted that the etching masks 70 and 80 can be made of a photoresist material, but they can be made of other suitable materials. The etching medium, which is used to remove the unreacted and exposed portion of the electrically conducting layer 28, is chosen according to the etching properties of the electrically conducting layer 28 and the fused, frame-like structure 49. So long as the fused, frame-like structure 49 is not subject to etching by the chosen etching medium, it would not be necessary to cover entirely the fused, frame-like structure 49 by the etching mask 80 during the etching process. Thus, the alignment of the etching mask 80, in reference to the fused, frame-like structure 49 and the top electrode 48, is not critical. Furthermore, it is sufficient that the alignment accuracy is better than the width of the fused, frame-like structure 49. If the thermally-activated alloy formation is a self-limiting reaction, it produces a frame-like structure 49 of a defined width and height with great accuracy.

Figure 6A:
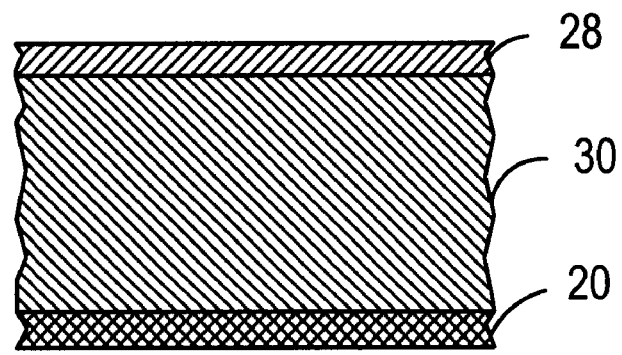
FIG. 6a is a cross sectional view illustrating a piezoelectric layer located between a first electrically conducting layer and a second electrically conducting layer.
Figure 6B:
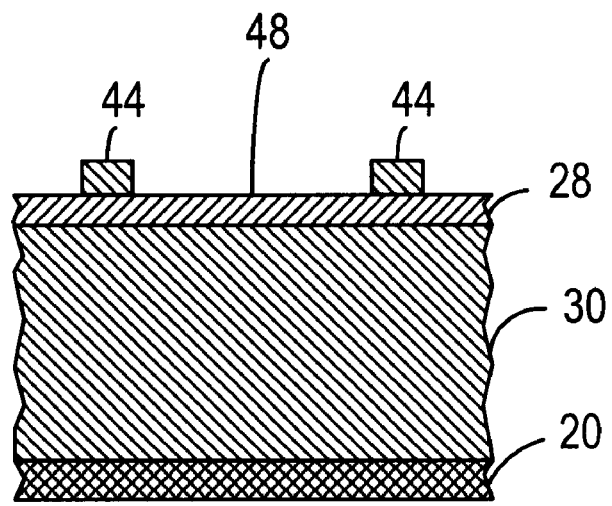
FIG. 6b is a cross sectional view illustrating how the frame-like structure is provided on the first electrically conducting layer, according to the present invention.
Figure 6C:
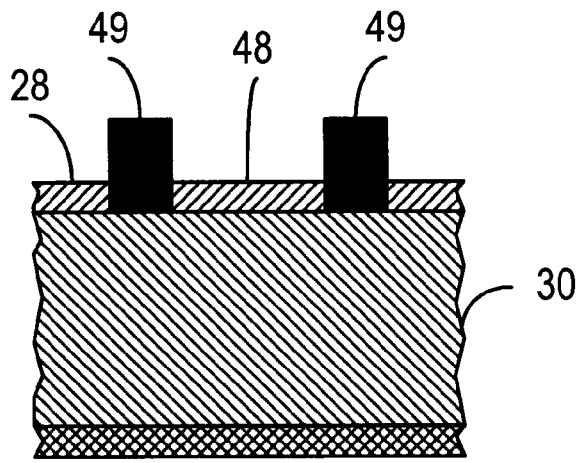
FIG. 6c is a cross sectional view illustrating how the frame-like structure and part of the electrically conducting layer are fused to form an alloy, according to the present invention.

FIGS. 5a–5j describe the process of fabricating a BAW resonator operating in the piston mode, wherein a dielectric layer 60 is used for passivation. However, passivation is not always needed. FIGS. 6a–6f illustrate the fabrication process for self-aligning FBAR structure without a passivation layer. As shown in FIG. 6a, the electrically conductive layer 28 is directly provided on the piezoelectric layer 30. A frame-like structure 44 is provided on the electrically conductive layer 28 at an appropriate location for the placement of the top electrode in later steps, as shown in FIG. 6b. As described in conjunction with FIGS. 5f–5g, the frame-like structure 44 and the electrically conductive layer 28 are made of different materials, so that the frame-like structure 44 and the contacting part of the electrically conductive layer 28 are fused by a heating process or any known process to become an alloy 49, as shown in FIG. 6c.

Figure 6D:
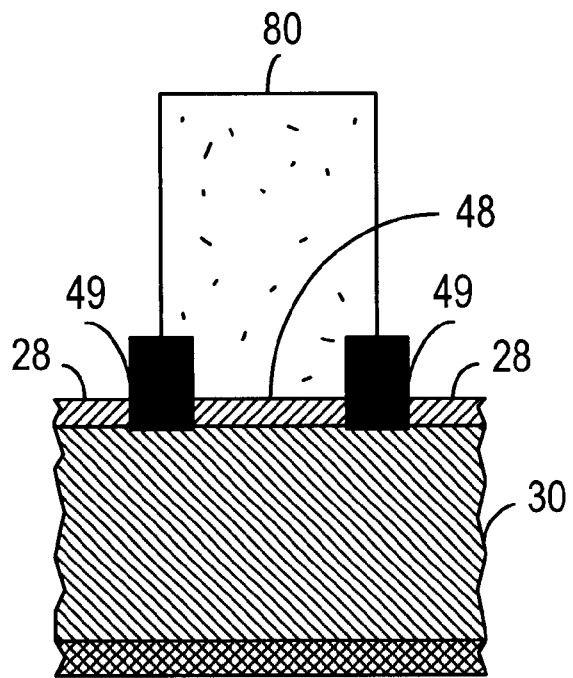
FIG. 6d is a cross sectional view illustrating how an etching mask is formed, according to the present invention.
Figure 6E:
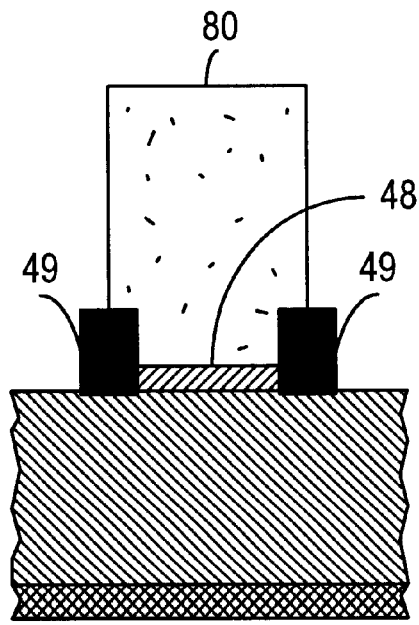
FIG. 6e is a cross sectional view illustrating how the exposed portion of the electrically conducting layer is removed to form the top electrode, according to the present invention.
Figure 6F:
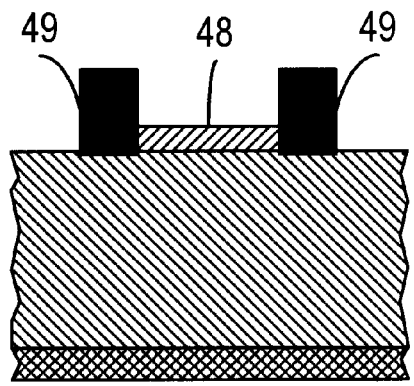
FIG. 6f is a cross sectional view illustrating the top electrode after the etching masked is removed.

As shown in FIG. 6d, an etching mask 80 is provided on top of the fused, frame-like structure 49 and the portion 48 of the electrically conducting layer 28 surrounded by the fused, frame-like structure 49. The electrically conducting layer 28 outside the fused, frame-like structure 49 is selectively etched by an etching medium, as shown in FIG. 6e. After the etching mask 80 is stripped, a BAW device operating in the piston mode is achieved, as shown in FIG. 6f.

The present invention has an analogy in silicon fabrication where the so-called salicide process is used to self-align the contacts of a transistor. In the salicide process, a thermal alloying step is carried out to fuse silicon and a refractory metal, and a selective etching step is carried out to remove the unreacted refractory metal from the substrate. However, the present invention is not limited to the salicide process. It should be noted that the object of the present invention is to achieve the suppression of spurious resonance in the piezoelectrically excited acoustic wave in a bulk acoustic wave device, and the object can be achieved by producing, in a self-aligning manner, a fused, frame-like structure along the edge of the top electrode of a bulk acoustic device. The scope of the present invention includes the fusing of a frame-like structure made of a material to a metal layer, so long as that material becomes an effective means for suppressing the spurious resonance after the material is fused to the metal.

It should be noted that the etching medium which is used to remove the exposed area 56 of the passivation layer 60, as described in conjunction with FIG. 5c, must have a certain etching property in that it is not an effective etching medium for the frame-like structure 44. In that respect, the frame-like structure 44 is said to have high etch selectivity against the passivation layer 60. However, the high selectivity of the frame-like structure 44 against the passivation layer 60 is not always necessary. For example, a hard mask material can be used to protect the frame-like structure 44, as shown in the fabrication process as shown in FIGS. 7a–7f.

Figure 7A:
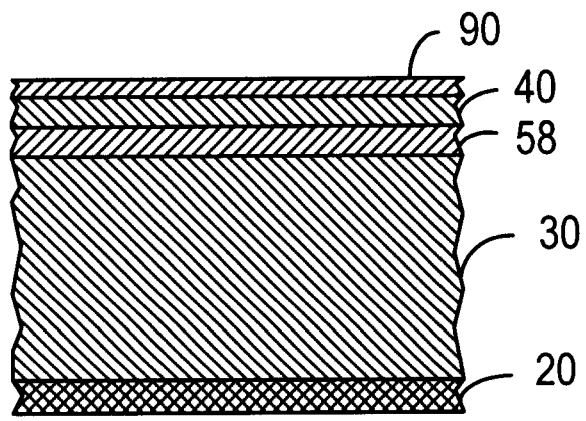
FIG. 7a is a cross sectional view illustrating a non-patterned dielectric layer provided on top of the piezoelectric layer, and a hard mask layer and an additional layer are provided on top of the dielectric layer.
Figure 7B:
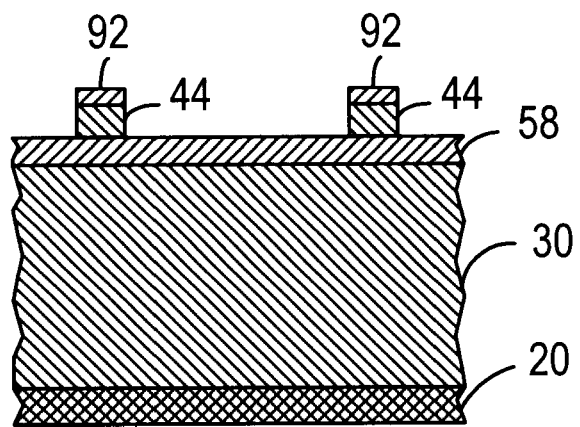
FIG. 7b is a cross sectional view illustrating how a frame-like structure is formed on top of the dielectric layer, and a hard mask is formed on top of the frame-like structure.
Figure 7C:
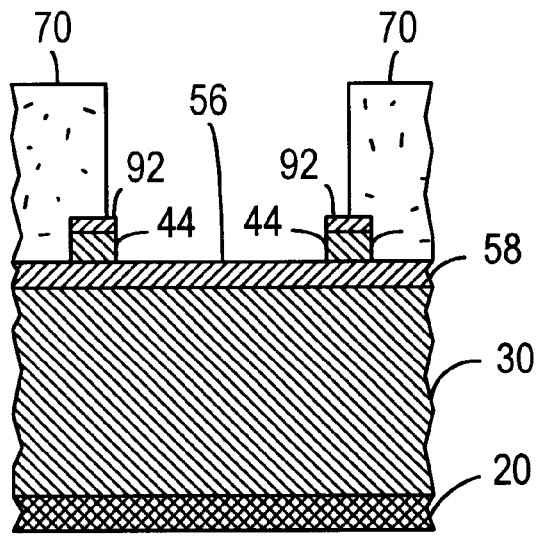
FIG. 7c is a cross sectional view illustrating how an etching mask is formed, according to the present invention.
Figure 7D:
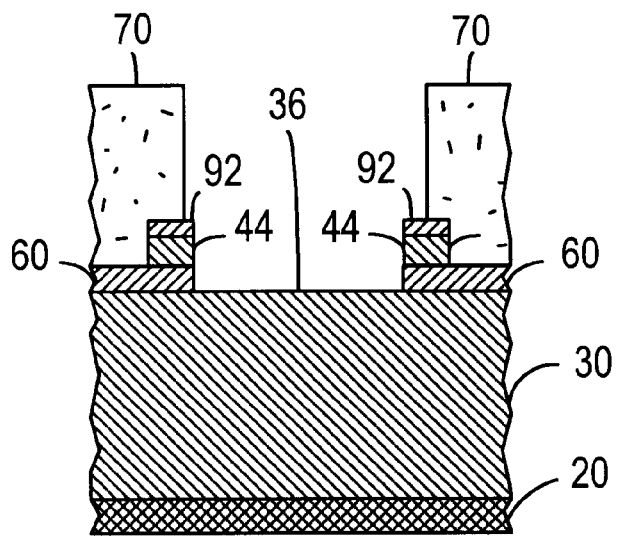
FIG. 7d is a cross sectional view illustrating how a section of the dielectric layer is removed, according to the present invention.
Figure 7E:
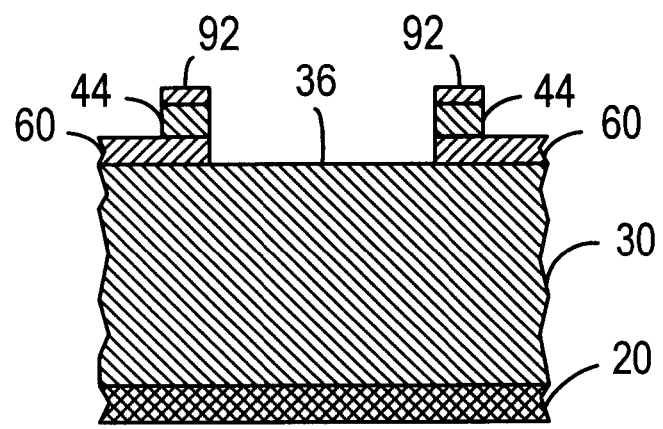
FIG. 7e is a cross sectional view illustrating the etching mask being removed.
Figure 7F:
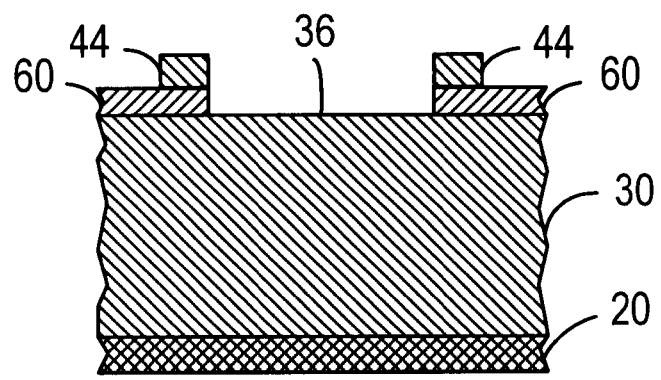
FIG. 7f is a cross sectional view illustrating the hard mask on top of the frame-like structure being removed.

As shown in FIG. 7a, the piezoelectric layer 30 is provided between a dielectric layer 58 and a bottom electrode 20. A layer 40 made of silicon or nickel is provided on top of the dielectric layer 58, and a hard mask layer 90 is provided on top of the layer 40. The hard mask layer 90 and the layer 40 are etched to form a frame-like structure 44 with a hard mask 92 formed on the frame-like structure 44, as shown in FIG. 7b. A photoresist mask 70 is formed on top of the hark mask 92 and the dielectric layer 58 outside the frame-like structure 44, leaving a portion 56 of the dielectric layer 58 exposed, as shown in FIG. 7c. The exposed portion 56 of the dielectric layer 58 is etched away from the piezoelectric layer 30, leaving a portion 36 of the piezoelectric layer 30 exposed, as shown in FIG. 7d. The remaining portion of the dielectric layer 58 becomes a passivation layer 60. The etching mask 70 is then stripped, as shown in FIG. 7e. It follows that the hard mask 92 is stripped, as shown in FIG. 7f. Preferably, the hard mask layer 90 is made of aluminum nitride (AlN), so that a fluorine plasma etching process can be used to etch away the exposed portion 56 of the dielectric layer 58, as described in conjunction with FIG. 7d. Aluminum nitride is known to be very resistive to fluorine plasma etching that is often used in $SiO_2$ or $Si_3N_4$ patterning. The thin layer of aluminum nitride (hard mask 92) can be easily stripped in a standard alkaline developer solution with high selectivity against the passivation layer 60 (dielectric) and the frame-like structure 44 (silicon or nickel). Now the layer structure, as shown in FIG. 7f, is the same as that shown in FIG. 5e. The remaining process steps have been described in conjunction to FIGS. 5f–5j.

It should be noted that the bulk acoustic wave devices with reduced spurious resonances, according to the present invention, include resonators, filters, stacked crystal filters and other low frequency devices, such as quartz crystals, or single crystal resonators. Thus, the piezoelectric layer in the bulk acoustic wave device can be polycrystalline or a single crystal. A single crystal resonator, according to the present invention, can be diagrammatically represented by FIG. 5j.

Thus, although the invention has been described with respect to a preferred embodiment thereof, it will be understood by those skilled in the art that the foregoing and various other changes, omissions and deviations in the form and detail thereof may be made without departing from the spirit and scope of this invention.

What is claimed is:

1. A bulk acoustic wave device with reduced spurious resonance, wherein the device has a piezoelectric layer having a first side and an opposing second side, a first electrode layer provided on the first side and a second electrode layer provided on the second side of the piezoelectric layer, said device comprising:

a frame-like structure in contact with the first electrode layer, wherein the frame-like structure has an outer border and an inner border, and the frame-like structure is caused to fuse with the contacting portion of the first electrode layer to form a fused portion, and wherein the fused portion defines a first section of the first electrode layer within the fused portion and a second section of the first electrode layer outside the fused portion, which is removed from the piezoelectric layer.

2. The device of claim 1, further comprising a dielectric layer provided on the piezoelectric layer and the frame-like structure provided on the dielectric layer prior border of the frame-like structure is removed to expose a section of the first side of the piezoelectric layer so as to allow the first electrode layer to be provided on the device in contact with the exposed section of the piezoelectric layer, the frame-like structure.

3. The device of claim 1, wherein the frame-like structure is made of silicon and the first electrode layer is made of titanium.

4. The device of claim 1, wherein the frame-like structure is made of nickel and the first electrode layer is made of aluminum.

5. The device of claim 1, comprising a bulk acoustic wave resonator.

6. The device of claim 1, comprising a bulk acoustic wave filter.

7. The device of claim 1, comprising a stacked crystal filter.

8. The device of claim 1, comprising a single crystal resonator.

* * * * *